United States Patent
Inada

(10) Patent No.: US 6,356,145 B1
(45) Date of Patent: Mar. 12, 2002

(54) DEMODULATOR CIRCUIT WHICH DEMODULATES A SIGNAL WITHOUT ANY RESTRICTION FROM A CLOCK SIGNAL

(75) Inventor: Yoshihiro Inada, Itami (JP)

(73) Assignees: Mitsubishi Denki Kabushiki Kaisha, Tokyo; Mitsubishi Electric System LSI Design Corporation, Itami, both of (JP)

( * ) Notice: Subject to any disclaimer, the term of this patent is extended or adjusted under 35 U.S.C. 154(b) by 0 days.

(21) Appl. No.: 09/593,933

(22) Filed: Jun. 15, 2000

(30) Foreign Application Priority Data

Dec. 27, 1999 (JP) ............................................. 11-370963

(51) Int. Cl.$^7$ ......................... H04N 9/66; H04N 5/455; H04L 27/22
(52) U.S. Cl. ....................... 329/304; 329/308; 348/641; 348/727
(58) Field of Search ................................. 329/304, 308, 329/309; 348/638, 641, 727

(56) References Cited

U.S. PATENT DOCUMENTS

| | | | | |
|---|---|---|---|---|
| 4,694,326 A | * | 9/1987 | Demmer | 348/508 |
| 5,703,526 A | * | 12/1997 | Meyer | 329/304 |
| 6,175,389 B1 | * | 1/2001 | Felts, III et al. | 348/663 |

FOREIGN PATENT DOCUMENTS

JP         08-298674         11/1996

* cited by examiner

*Primary Examiner*—Siegfried H. Grimm
(74) *Attorney, Agent, or Firm*—Burns, Doane, Swecker & Mathis, LLP

(57) ABSTRACT

A demodulator circuit including: a signal generating circuit for generating a sine-wave signal and a cosine-wave signal whose frequencies are same as that of the carrier wave of a modulated signal, a multiplying circuit for multiplying the modulated signal by the sine-wave signal and the cosine-wave signal generated by the signal generating circuit, and a filtering circuit for eliminating the frequency twice as high as that of the carrier wave from each of the results of the computation conducted by the multiplying circuit. Due to this, no restriction is imposed by the frequency of the system clock signal in configuring the system as a whole.

5 Claims, 4 Drawing Sheets

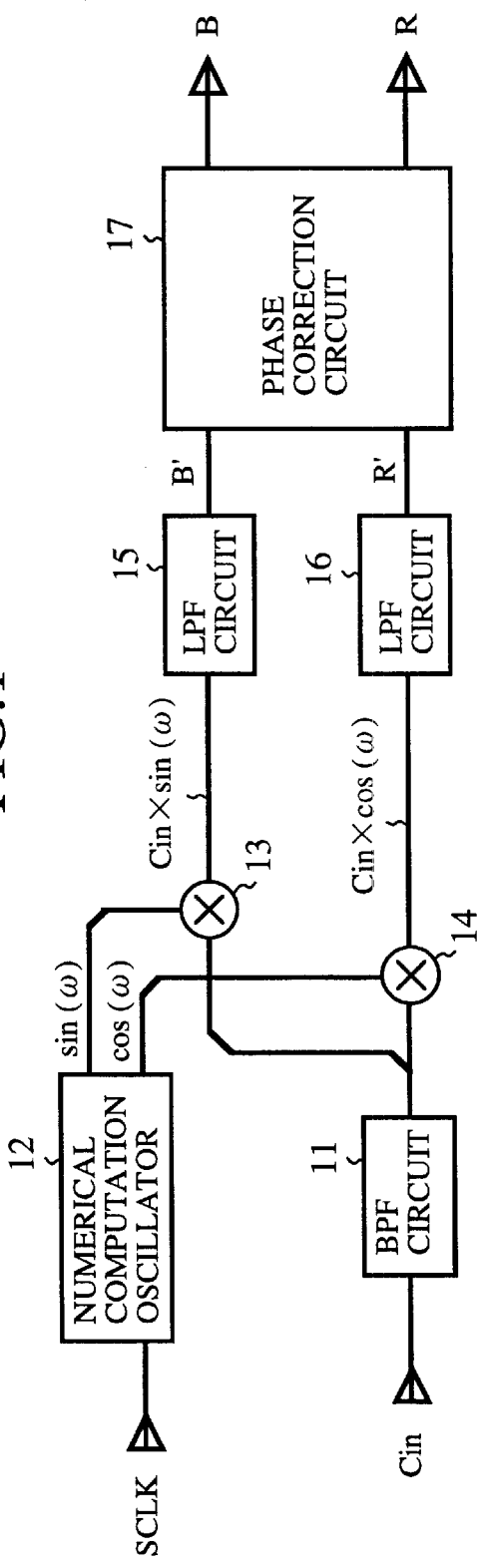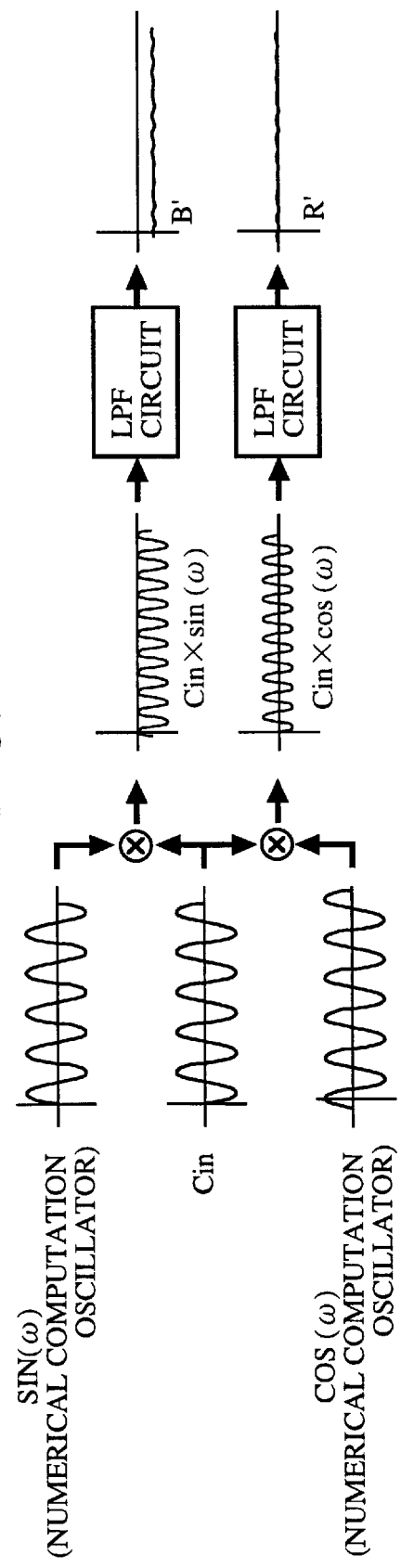

Cin

BURST SIGNAL
COMPONENT

VIDEO SIGNAL
COMPONENT

US 6,356,145 B1

DEMODULATOR CIRCUIT WHICH DEMODULATES A SIGNAL WITHOUT ANY RESTRICTION FROM A CLOCK SIGNAL

BACKGROUND OF THE INVENTION

1. Field of the Invention

The present invention relates to a demodulator circuit for demodulating a signal which has been modulated by an arbitrarily set carrier frequency.

2. Description of the Related Art

FIG. 5 is a schematic diagram showing a conventional demodulator circuit. In the figure, reference numeral 1 denotes a first frequency divider, which synchronizes with the falling edge of a clock signal SCLK that is a system clock and outputs a frequency-divided signal BRSEL, numeral 2 denotes a second frequency divider, which synchronizes with the falling edge of the BRSEL signal output from the first frequency divider 1 and outputs a frequency-divided signal NPSEL, numeral 3 denotes an inverter that inverts the frequency-divided signal BRSEL fed from the first frequency divider 1 for outputting an inverted signal NBRSEL, numeral 4 denotes a complement-of-2 generating circuit (hereinafter may be referred to just as a "complement circuit") for outputting a complement-of-2 signal NCin by multiplying a modulated signal Cin by "−1", and reference numeral 5 denotes a data selection circuit, which selects and outputs the complement-of-2 signal NCin output from the complement circuit 4 when the frequency-divided signal NPSEL fed from the second frequency divider 2 is "1", whereas it selects and outputs the modulated signal Cin itself when the frequency-divided signal NPSEL is "0".

Further, reference numeral 6 denotes a first D flip-flop circuit with an enable-input terminal (hereinafter abbreviated to an enable-containing D-FF), which, when the frequency-divided signal BRSEL output from the first frequency divider 1 is "1", synchronizes with the rising edge of the clock signal SCLK, and outputs a data input signal CABS from the data selection circuit 5 as an output signal BY, whereas reference numeral 7 denotes a second enable-containing DFF circuit, which, when the inverted signal NBRSEL output from the inverter 3 is "1", synchronizes with the rising edge of the clock signal SCLK, and outputs a data input signal CABS from the data selection circuit 5 as an output signal RY.

The operation of the above conventional demodulator circuit is explained as follows.

It is to be noted that the frequency of the clock signal SCLK in this conventional demodulator circuit is 4 times as high as that of the carrier wave of the modulated signal Cin, wherein the modulated signal Cin has been made in such a manner that the B component and the R component have been orthogonally 2-phase balance modulated by specified carrier frequency.

First of all, as shown in FIG. 6, the first frequency divider 1 synchronizes with the falling edge of the clock signal SCLK, and outputs a frequency-divided signal BRSEL, whereas the second frequency divider 2 synchronizes with the falling edge of the thus output frequency-divided signal BRSEL and outputs a frequency-divided signal NPSEL. Further, the inverter 3 inverts the BRSEL output from the first frequency divider 1 and outputs an inverted signal NBRSEL.

On the other hand, the complementary circuit 4 outputs a complement-of-2 signal NCin by multiplying a modulated signal Cin by "−1", and thereafter the data selection circuit 5 selects the complement-of-2 signal NCin thus output from the complement circuit 4 when the frequency-divided signal NPSEL fed from the second frequency divider 2 is "1", and outputs the NCin signal to the enable-containing DFF circuits 6 and 7 as the data input signal CABS, whereas the circuit 5 selects the modulated signal Cin itself when the frequency-divided signal NPSEL is "0", and outputs the Cin signal to the enable-containing D-FF circuits 6 and 7 as the data input signal CABS.

The first enable-containing D-FF circuit 6 synchronizes, when the frequency divided signal BRSEL fed from the first frequency divider 1 is "1", with the rising edge of the clock signal SCLK and outputs the data input signal CABS from the data selection circuit 5 as an output signal BY, whereas the second enable-containing D-FF circuit 7 synchronizes, when the inverted signal NBRSEL fed from the inverter 3 is "1", with the rising edge of the clock signal SCLK, and outputs the data input signal CABS from the data selection circuit 5 as an output signal RY.

Due to these operations, in the case where the modulated signal is a signal having the contents of "+B1, −R1, −B2, +R2, +B3, −R3, −B4, +R4, . . . ", as shown in FIG. 6, the signal output from the first enable-containing DFF circuit 6 will be a signal BY having the contents of "B1, B2, B3, B4, . . . ", whereas the signal output from the second enable-containing DFF circuit 7 will be a signal RY having the contents of "R1, R2, R3, R4, . . . ".

Since the conventional demodulator circuit is configured as such, the modulated signal Cin can be correctly demodulated if the frequency of the clock signal SCLK is made 4 times as high as that of the carrier wave of the modulated signal Cin. However, the modulated signal will not be demodulated properly if the frequency of the clock signal SCLK is not made as high as a multiple of 4 times of that of the carrier wave of the modulated signal Cin, so that a certain restriction is definitely imposed by the frequency of the clock signal SCLK in configuring the system as a whole.

SUMMARY OF THE INVENTION

The present invention has been proposed to solve the problems aforementioned, and it is an object of the present invention to provide a demodulator circuit capable of demodulating a modulated signal without any restriction imposed by the frequency of the clock signal.

In order to achieve the above object, the demodulator circuit according to one aspect of the present invention is constructed such that it comprises a signal generating means for generating a sine-wave signal and a cosine-wave signal whose frequencies are same as that of the carrier wave of a modulated signal, a multiplying means for multiplying the modulated signal by the sine-wave signal and the cosine-wave signal generated by said signal generating means, and a filtering means for eliminating the frequency twice as high as that of the carrier wave from each of the results of the computation conducted by said multiplying means.

The demodulator circuit according to another aspect of the present invention is so constructed as being provided with a phase correction means for eliminating a signal component corresponding to the phase angle difference remaining in each of the demodulated signals output from the filtering means.

The demodulator circuit according to a further aspect of the present invention is constructed such that it includes a band-pass filter that excludes all the frequency components contained in the modulated signal except the carrier frequency, which band-pass filter being provided in the stage prior to the multiplying means.

The demodulator circuit according to a further aspect of the present invention is constructed such that the signal generating means further comprises: a base-value storage register for storing the predetermined base value, an output-value updating means for successively adding a base value in synchronization with the system clock, a Sin converter for converting the signal output from the output-value updating means and generating a sine-wave signal whose frequency is same as that of the carrier wave, and a Cos converter for converting the signal output from the output-value updating means and generating a cosine-wave signal whose frequency is same as that of the carrier wave.

The demodulator circuit according to a further aspect of the present invention is constructed such that the Sin converter and the Cos converter convert only some specified bits of the signal output from the output-value updating means.

The demodulator circuit according to still a further aspect of the present invention is constructed such that the output-value updating means is composed of an adder means and a D-FF circuit, which D-FF circuit synchronizing with the system clock and successively adding the base value from the base-value storage register to the resulted value previously stored in the D-FF circuit at each synchronization.

The demodulator circuit according to yet still a further aspect of the present invention is constructed such that the demodulator circuit uses a chroma signal of a video signal as the modulated signal.

BRIEF DESCRIPTION OF THE DRAWINGS

FIG. 1 is a schematic diagram showing the demodulator circuit according to one embodiment of the present invention.

FIG. 2 shows various waveforms including the modulated signal Cin, and sin($\omega$) and cos($\omega$) output from the numerical computation oscillator 12, together with the resultant waveforms after the modulated signal Cin is multiplied by the sin($\omega$) and cos($\omega$), respectively.

DETAILED DESCRIPTION OF THE PREFERRED EMBODIMENTS

Figure 3:
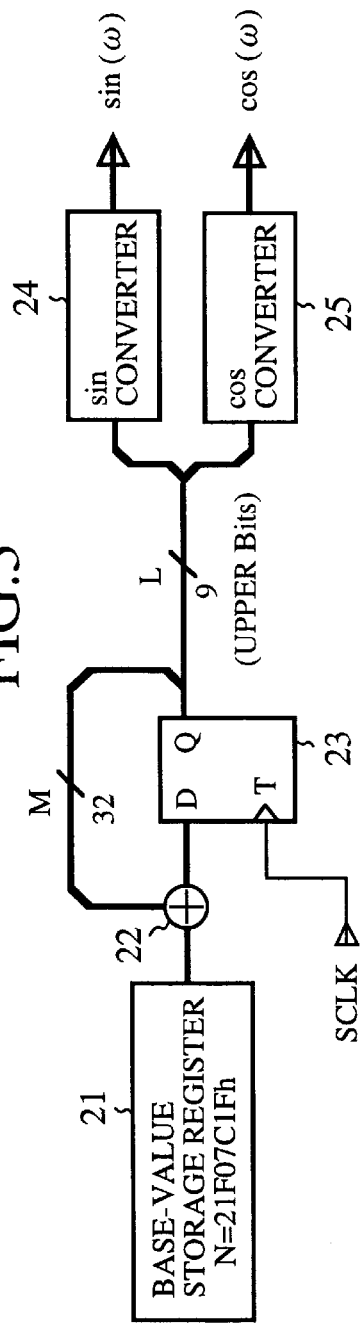
FIG. 3 is a schematic diagram showing the inner construction of a numerical computation oscillator 12.
Figure 5:
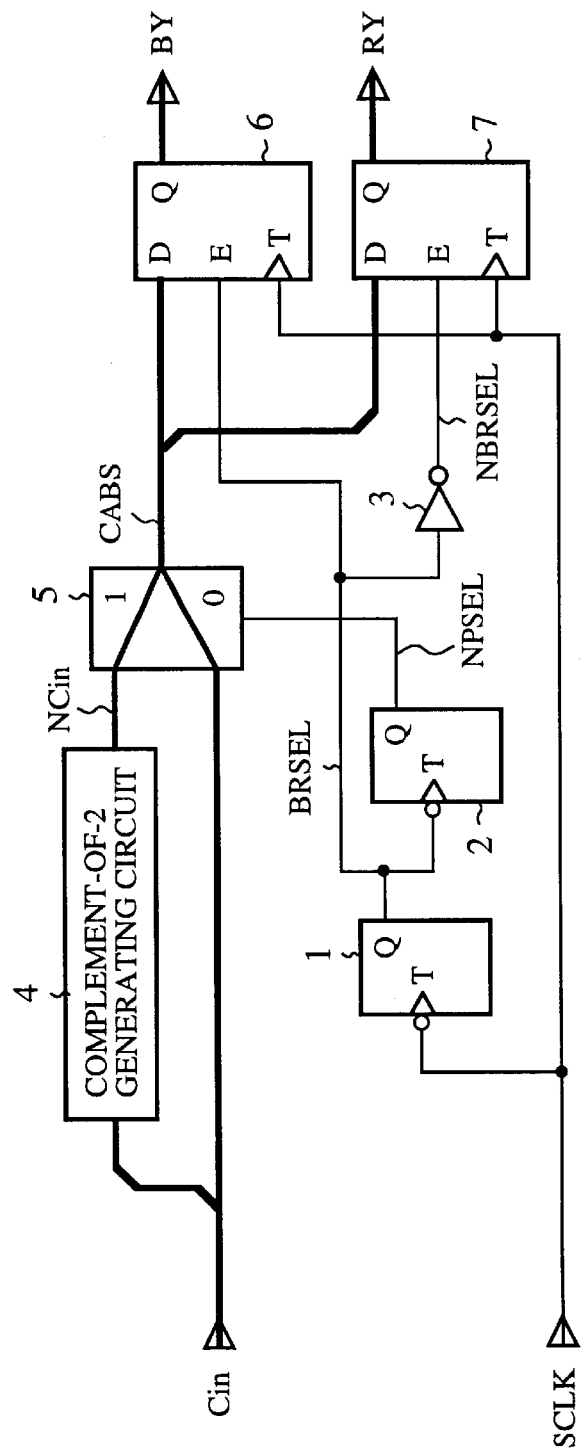
FIG. 5 is a schematic diagram showing the conventional demodulator circuit.

One embodiment of the present invention is now explained as in the followings.

FIG. 1 is a schematic diagram showing a demodulator circuit according to one embodiment of the present invention.

In the figure, reference numeral 11 denotes a band-pass filter (hereinafter may be referred to just as a "BPF"), which eliminates all the frequency components included in the chroma signal Cin as a modulated signal except frequency $\omega$ of the carrier wave, reference numeral 12 denotes a numerical operation oscillator that generates a sine-wave signal sin($\omega$) and a cosine-wave signal cos($\omega$) whose frequencies are same as that of the carrier wave of the chroma signal Cin, reference numeral 13 denotes a first multiplier that multiplies the chroma signal Cin output from the BPF 11 by the sine-wave signal sin($\omega$) generated by the numerical operation oscillator 12, reference numeral 14 denotes a second multiplier that multiplies the chroma signal Cin output from the BPF circuit 11 by the cosine-wave signal cos($\omega$) generated by the numeral operation oscillator 12. It is to be noted that a multiplying means is configured by these multipliers 13 and 14.

Reference numeral 15 denotes a first low-pass filter (hereinafter may be referred to just as an "LPF") that eliminates the frequency component which is twice as high as that of the carrier wave $\omega$ from the result of the computation conducted in the first multiplier 13 and outputs a B component of the chroma signal as a demodulated signal, whereas reference numeral 16 denotes a second LPF circuit that eliminates the frequency component which is twice as high as that of the carrier wave $\omega$ from the result of the computation conducted in the second multiplier 14 and outputs an R component of the chroma signal as a demodulated signal. Reference numeral 17 denotes a phase correction circuit (correction means) for eliminating the phase angle difference remaining in the B and P components of the chroma signal which are output respectively from the first LPF 15 and the second LPF 16.

FIG. 3 is a schematic diagram showing the inner construction of the numerical computation oscillator 12. In the figure, reference numeral 21 denotes a base-value register that stores the base value for determining the frequency of the sine-wave signal sin($\omega$) and the cosine-wave signal cos($\omega$), reference numeral 22 denotes an adder for successively adding the base value to the value output from the D flip-flop circuit (or simply D-FF) 23, wherein the D-FF circuit 23 synchronizes with the clock signal SCLK and outputs the result of addition conducted at the adder 22. Further, reference numeral 24 denotes a Sin converter for converting the upper 9 bits of the output value of the D-FF circuit 23 to the sine-wave signal sin($\omega$), and reference numeral 25 denotes a Cos converter for converting the upper 9 bits of the output value of the D-FF circuit 23 to the cosine-wave signal cos($\omega$).

The operation of the demodulator circuit according to the present embodiment is as follows.

Figure 4:
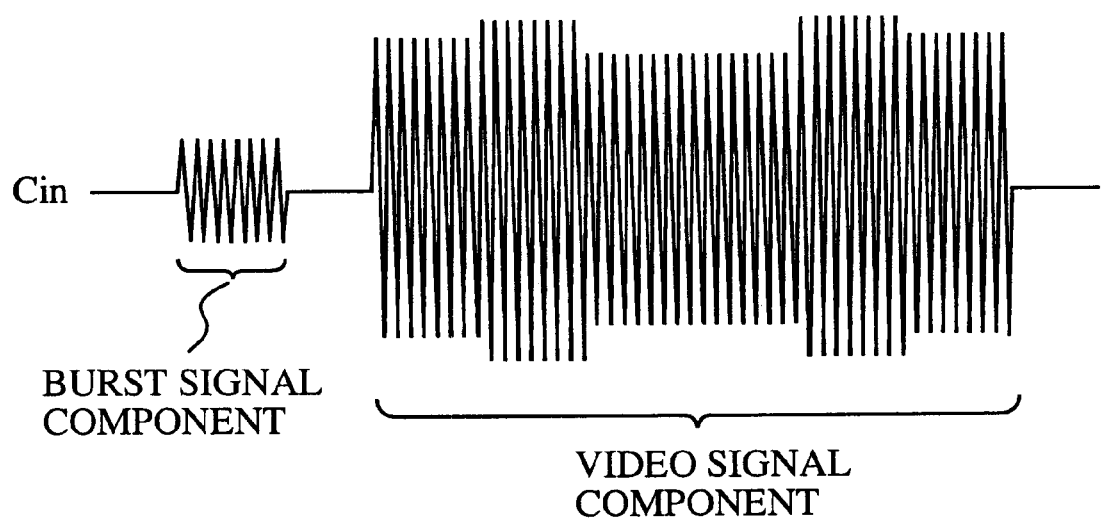
FIG. 4 is an explanatory view showing the signal components of the chroma signal.
Figure 6:
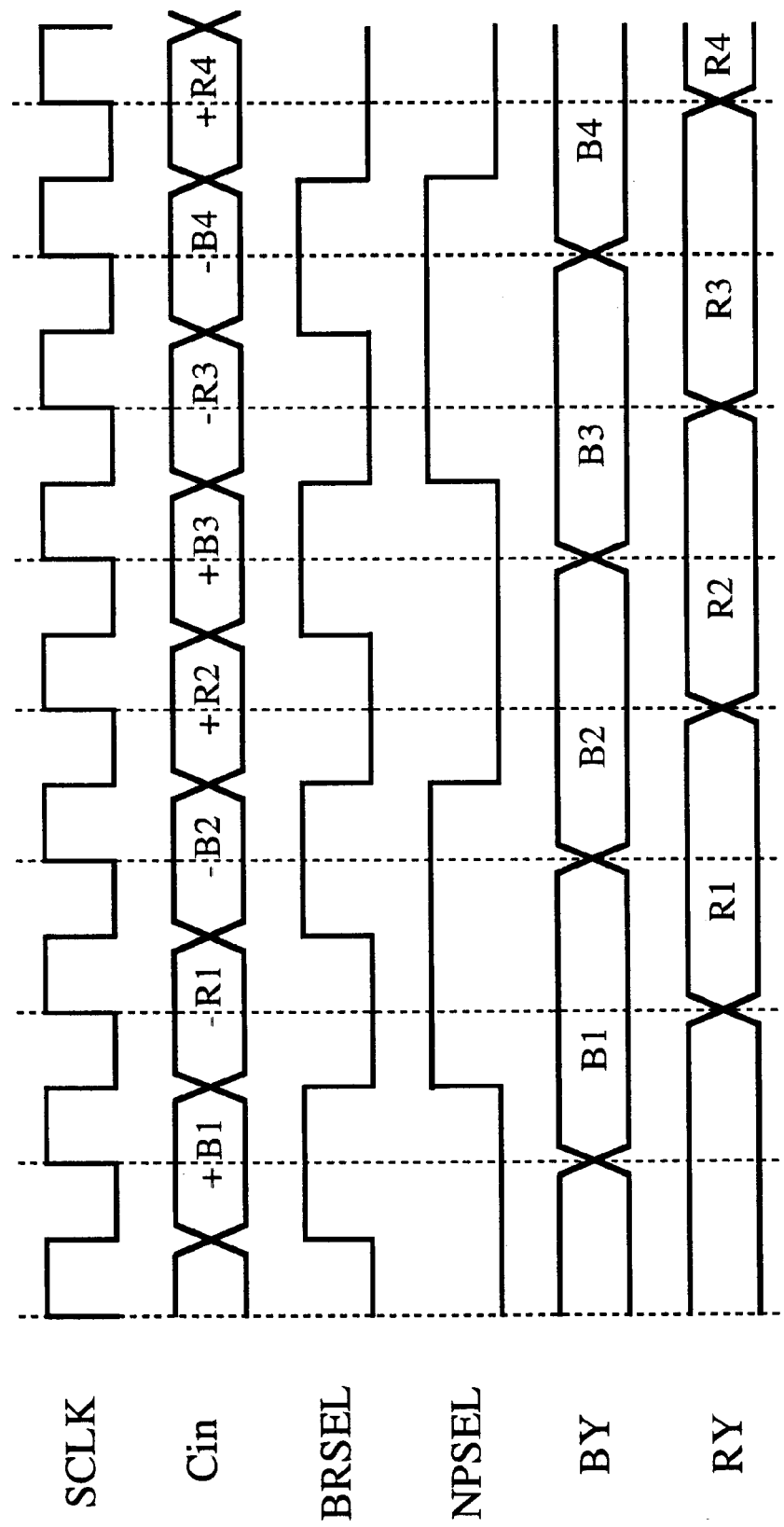
FIG. 6 shows waveforms for explaining the timing for various signals.

The demodulator circuit of the present embodiment inputs a chroma signal Cin as a modulated signal, demodulates the thus input chroma signal, and outputs the B and R components thereof. However, the chroma signal Cin is, as shown in FIG. 4, composed of a burst signal component and a video signal component. It should be noted that the burst signal shown therein is made by inverting the phase of the carrier wave of the modulated signal for an angle of 180 degree, and is used as the base phase for the demodulating operation.

First of all, when the BPF 11 inputs a chroma signal Cin as a modulated signal, it excludes all the frequency components contained in the chroma signal Cin except frequency $\omega$ of the carrier wave, and outputs the chroma signal Cin that has passed through the BPF 11 to the multipliers 13 and 14.

On the other hand, the numerical computation oscillator 12 generates a sine-wave signal sin($\omega$) and a cosine-wave signal cos($\omega$) whose frequencies are same as the carrier-wave frequency of the chroma signal.

In other words, when the D-FF circuit 23 in the numerical computation oscillator 12 synchronizes with the clock signal SCLK and makes the base value stored in the base-value storage register 21 added to the resultant value in the adder 22, it computes the phase angle between the clock signal SCLK and the sine-wave signal sin($\omega$) and that between the clock signal SCLK and the cosine-wave signal cos($\omega$).

Thereafter, the Sin converter 24 obtains the sine-wave signal sin($\omega$) by sine-converting the thus computed phase angle (the upper 9 bits of the output value of the D-FF circuit 23), and outputs the thus obtained sine-wave signal sin($\omega$) to the first multiplier 13.

On the other hand, the Cos converter 24 obtains the cosine-wave signal cos($\omega$) by cosine-converting the thus computed phase angle (the upper 9 bits of the output value of the D-FF circuit 23), and outputs the thus obtained cosine-wave signal cos($\omega$) to the second multiplier 14.

Here, if the base value stored in the base-value storage register 21 is represented as N, the frequency of the clock signal SCLK is represented as SCLKf, and the bit width of the output of the D-FF circuit 23 is represented as M, then the frequency Fout of the output signal of the Sin converter 24 and the Cos converter 25 (ideally Fout equals to the value of ω) will be obtained by the following formula:

$$Fout = SCLKf \times N \div 2^M$$

The frequency resolution Δf of the output signal in this case will be obtained by the following formula:

$$\Delta f = SCLKf \div 2^M$$

Further, the phase resolution Δθ of this output signal and of the ideal signal will be obtained by the following formula, on condition that the bit width to be provided to the Sin converter 24 and the Cos converter 25 is L:

$$\Delta\theta = 360 \div 2^L$$

As is obvious from the above, in the numerical computation oscillator 12, an output signal of a desired frequency can be generated by suitably modifying the base value N to be stored in the base-value storage register 21.

In this way, when the numerical computation oscillator 12 outputs the sine-wave signal sin(ω) and the cosine-wave cos(ω), the chroma signal Cin is demodulated by use of these signals. However, since the chroma signal Cin has been modulated such that the B component and the R component thereof are orthogonally 2-phase balance modulated by the burst frequency signal (See FIG. 2), the chroma signal Cin can be represented as follows:

$$Cin = R \cdot \cos(\omega) + B \cdot \sin(\omega)$$

Since the burst signal portion is phase shifted for 180 degree with respect to the demodulation axis, the chroma signal Cin of the burst signal portion will be represented as follows:

$$Cin = R \cdot \cos(\pi + \omega) + B \cdot \sin(\pi + \omega) = -R \cdot \cos(\omega) - B \cdot \sin(\omega)$$

Due to this, if the first multiplier 13 multiplies the chroma signal Cin of the burst portion output from the BPF 11 by the sine-wave signal sin(ωθ) output from the numerical computation oscillator 12, the result will be as shown below, wherein θ is a phase difference between the burst signal portion of the chroma signal Cin and the cosine-wave signal cos(ω) and that between the burst signal portion of the chroma signal Cin and the sine-wave signal sin(ω). Although θ=0 is desirable from an idealistic viewpoint, normally there exist slight errors in reality, and for this very reason, θ is taken into consideration.

$$Cin \cdot \sin(\omega\theta) = (-R \cdot \cos(\omega) - B \cdot \sin(\omega)) \cdot \sin(\omega\theta) = (-R \cdot \sin(2\omega) \cdot \cos(\theta))/2 + (-R \cdot \sin(\theta))/2 + (-R \cdot \cos(2\omega) \cdot \sin(\theta))/2 + (-B \cdot \cos(\theta))/2 - (-B \cdot \cos(2\omega) \cdot \cos(\theta))/2 + (-B \cdot \sin(2\omega) \cdot \sin(\theta))/2$$

Similarly, if the second multiplier 14 multiplies the chroma signal Cin of the burst signal portion output from the BPF 11 by the cosine-wave signal cos(ω+θ)) output from the numeric computational oscillator 12, the result will be as shown below:

$$Cin \cdot \cos(\omega+\theta)) = (-R \cdot \cos(\omega) - B \cdot \sin(\omega)) \cdot \cos(\omega+\theta)) = (-R \cdot \cos(\theta))/2 + (-R \cdot \cos(2\omega) \cdot \cos(\theta))/2 - (-R \cdot \sin(2\omega) \cdot \sin(\theta))/2 + (-B \cdot \sin(2\omega) \cdot \cos(\theta))/2 - (-B \cdot \sin(\theta))/2 + (-B \cdot \cos(2\omega) \cdot \sin(\theta))/2$$

The first LPF circuit 15 eliminates the frequency component twice as high as that of the burst signal portion, which is a frequency component 2ω, on the basis of the result of the computation conducted in the first multiplier 13. In other words, as to the result of the computation, the condition "cos(2ω)=sin(2ω)=0" is set, and in this case, the formula can be expressed as below:

$$Cin \cdot \sin(\omega+\theta)) = -R \cdot 0 \cdot \cos(\theta)/2 - R \cdot \sin(\theta)/2 - R \cdot 0 \cdot \sin(\theta)/2 - B \cdot \cos(\theta)/2 + B \cdot 0 \cdot \cos(\theta)/2 - B \cdot 0 \cdot \sin(\theta)/2 = (-B \cdot \sin(\theta) - B \cdot \cos(\theta))/2 \quad (1)$$

The LPF second circuit 16 eliminates the frequency component twice as high as that of the burst portion, which is a frequency component 2ω, on the basis of the result of the computation conducted in the second multiplier 14. In other words, as to the result of the computation at the multiplexer 14, the condition "cos(2ω)=sin(2ω)=0" is set, and in this case, the formula can be expressed as below:

$$Cin \cos(\omega+\theta) = -B \cdot \cos(\theta)/2 - B \cdot 0 \cdot \cos(\theta)/2 + R \cdot 0 \cdot \sin(\theta)/2 - B \cdot 0 \cdot \cos(\theta)/2 + B \cdot \sin(\theta)/2 - B \cdot 0 \cdot \sin(\theta)/2 = (-R \cdot \cos(\theta) + B \cdot \sin(\theta))/2 \quad (2)$$

In these formulae (1) and (2), if θ=0, then the following formulae can be obtained, and thus the B component and the R component can be demodulated from the chroma signal Cin:

$$Cin \cdot \sin(\omega+0) = -B/2 \quad (3)$$

$$Cin \cdot \cos(\omega+0) = -R/2 \quad (4)$$

On the other hand, if θ≠0, then a signal component corresponding to the phase angle difference remains in the B component and the R component demodulated from the chroma signal Cin.

The phase correction circuit 17 operates the following correcting operation in order to eliminate the signal component corresponding to the phase angle difference remaining in each of the B component and the R component demodulated from the chroma signal Cin. It should be noted here that the B and R components before correction are represented as B' and R', respectively, and those after correction are represented as B and R, respectively.

First of all, the components B' and R' as input signals of the phase correction circuit 17 will be represented as follows:

$$Cin \cdot \sin(\omega+0) = B' = (-R \cdot \sin(\theta) - B \cdot \cos(\theta))/2 \quad (5)$$

and, $$Cin \cdot \cos(\omega+\theta) = R' = (-R \cdot \cos(\theta) + B \cdot \sin(\theta))/2 \quad (6)$$

From these formulae (5) and (6), B and R can be expressed as shown in the following formulae (7) and (8), whereby the phase correction circuit 17 outputs the computation result obtained by these formulae as the corrected value for each case.

$$B = -2B' \cdot \cos(\theta) + 2R' \cdot \sin(\theta) \quad (7)$$

$$R = -2B' \cdot \sin(\theta) - 2R' \cdot \cos(\theta) \quad (8)$$

It should be noted, however, that the value of cos(θ) and sin(θ) in the formulae (7) and (8) can be obtained in the following manner.

First, since the burst signal component of the chroma signal Cin is phase shifted for 180 degree with respect to the carrier frequency (demodulation axis), there exists only the B component, and the R component does not exist, and due to this, the formulae (5) and (6) can be modified as shown in the followings, wherein R_Bst denotes the wave height of the R component, while B_Bst denotes that of the R component.

$$B' = (-R\_Bst \cdot \sin(\theta) - B\_Bst \cdot \cos(\theta))/2 = (-0 \cdot \sin(\theta) - B\_Bst \cdot \cos(\theta))/2 = -B\_Bst \cdot \cos(\theta)/2 \quad (9)$$

and, $$R' = (-R\_Bst \cdot \cos(\theta) + B\_Bst \cdot \sin(\theta))/2 = (-0 \cdot \cos(\theta) + B\_Bst \cdot \sin(\theta))/2 = B\_Bst \cdot \sin(\theta)/2 \quad (10)$$

Then, if $\cos(\theta)$ and $\sin(\theta)$ are eliminated by modifying the formulae (9) and (10), the following formula can be obtained:

$$(B')^2+(R')^2=(-B\_Bst\cdot\cos(\theta)/2)^2+(B\_Bst\cdot\sin(\theta)/2)^2=B\_Bst^2\cdot\cos^2(\theta)/4)+B\_Bst^2\cdot\sin^2(\theta)/4=B\_Bst^2(\cos^2(\theta)+\sin^2(\theta))/4=B\_Bst^2/4 \quad (11)$$

By this operation, the wave height B__Bst that is an amplitude of the burst signal portion can be obtained.

Further, from the thus obtained wave height B__Bst together with the formulae (9) and (10), $\cos(\theta)$ and $\sin(\theta)$ in the formulae (7) and (8) can be obtained as in the followings:

$$\cos(\theta)=-2B'/B\_Bst \quad (12)$$

$$\sin(\theta)=2R'/B\_Bst \quad (13)$$

As is obvious from the above, according to this embodiment, since there is provided a numerical computation oscillator 12 for generating a sine-wave signal $\sin(\omega)$ and a cosine-wave signal $\cos(\omega)$ whose frequencies are same as the carrier frequency $\omega$ of the chroma signal Cin, and the chroma signal Cin is multiplied by these sine-wave signal $\sin(\omega)$ and the cosine-wave signal $\cos(\omega)$, the chroma signal Cin can be demodulated even without any restriction imposed by the frequency of the clock signal SCLK.

As explained heretofore, according to the present invention, since there is provided a numerical computation oscillator 12 for generating a sine-wave signal $\sin(\omega)$ and a cosine-wave signal $\cos(\omega)$ whose frequencies are same as the carrier wave frequency $\omega$ of the chroma signal Cin, and the chroma signal Cin is multiplied by these sine-wave signal $\sin(\omega)$ and the cosine-wave signal $\cos(\omega)$, the chroma signal Cin can be demodulated even without any restriction imposed by the clock signal SCLK.

Further, according to the present invention, since there is provided a phase correction circuit for eliminating a signal component corresponding to the phase angle difference remaining in each of the demodulated signals output from the filtering means, modulated signals can be precisely demodulated.

Still further, according to the present invention, since there is provided a band-pass filter that eliminates all the frequency components contained in the modulated signal except the carrier frequency in the stage provided prior to the multiplying means, modulated signals can be demodulated precisely.

Still further, according to the present invention, since the demodulator circuit comprises a signal generating means that successively adds the base value in synchronization with the system clock, and inputs the computed results to a Sin converter and a Cos converter so as to generate a sine-wave signal and a cos-wave signal whose frequencies are same as that of the carrier wave, the sine wave and the cosine wave whose frequencies are same as that of the carrier wave can be readily generated with a simple construction.

Yet still further, according to the present invention, since a chroma signal of a video signal is used as the modulated signal, video signals can also be demodulated.

What is claimed is:

1. A demodulator circuit comprising:
    a signal generating means for generating a sine-wave signal and a cosine-wave signal whose frequencies are same as that of the carrier wave of a modulated signal,
    a multiplying means including first and second multipliers for multiplying the modulated signal respectively by the sine-wave signal and the cosine-wave signal generated by said signal generating means, and
    a filtering means including a first and a second low-pass filters for eliminating the frequency twice as high as that of the carrier wave from the result of computation conducted in each of said first and second multipliers,
    wherein said signal generating means further comprises:
        a base-value storage register for storing the predetermined base value,
        an output-value updating means for successively adding a base value in synchronization with the system clock,
        a Sin converter for converting the signal output from said output-value updating means and generating a sine-wave signal whose frequency is same as that of the carrier wave, and
        a Cos converter for converting the signal output from said output-value updating means and generating a cosine-wave signal whose frequency is same as that of the carrier wave,
        wherein said Sin converter and said Cos converter convert only some specified bits of the signal output from said output-value updating means.

2. A demodulator circuit according to claim 1, further comprising a phase correction means for eliminating a signal component corresponding to the phase angle remaining in each of the demodulated signals output from said filtering means.

3. A demodulator circuit according to claim 1 further comprising a band-pass filter that excludes all the frequency components contained in the modulated signal except the carrier frequency, said band-pass filter being provided in the stage prior to said multiplying means.

4. A demodulator circuit according to claim 1 wherein said demodulator circuit uses a chroma signal of a video signal as the modulated signal.

5. A demodulator circuit comprising:
    a signal generating means for generating a sine-wave signal and a cosine-wave signal whose frequencies are same as that of the carrier wave of a modulated signal,
    a multiplying means including first and second multipliers for multiplying the modulated signal respectively by the sine-wave signal and the cosine-wave signal generated by said signal generating means, and
    a filtering means including a first and a second low-pass filters for eliminating the frequency twice as high as that of the carrier wave from the result of computation conducted in each of said first and second multipliers,
    wherein said signal generating means further comprises:
        a base-value storage register for storing the predetermined base value,
        an output-value updating means for successively adding a base value in synchronization with the system clock,
        a Sin converter for converting the signal output from said output-value updating means and generating a sine-wave signal whose frequency is same as that of the carrier wave, and
        a Cos converter for converting the signal output from said output-value updating means and generating a cosine-wave signal whose frequency is same as that of the carrier wave,
    wherein said output-value updating means is composed of an adder means and a D-FF circuit, said D-FF circuit synchronizing with the system clock and successively adding the base value from said base-value storage register to the resulted value previously stored in said D-FF circuit at each synchronization.

* * * * *